United States Patent
Borgonovo et al.

(10) Patent No.: US 11,742,049 B2
(45) Date of Patent: Aug. 29, 2023

(54) HARDWARE ACCELERATOR DEVICE, CORRESPONDING SYSTEM AND METHOD OF OPERATION

(71) Applicant: STMicroelectronics S.r.l., Agrate Brianza (IT)

(72) Inventors: Giampiero Borgonovo, Giussano (IT); Lorenzo Re Fiorentin, Turin (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 10 days.

(21) Appl. No.: 17/453,811

(22) Filed: Nov. 5, 2021

(65) Prior Publication Data
US 2022/0180959 A1 Jun. 9, 2022

(30) Foreign Application Priority Data
Dec. 3, 2020 (IT) .................. 102020000029759

(51) Int. Cl.
*G11C 29/42* (2006.01)
*G11C 29/12* (2006.01)
*G11C 29/18* (2006.01)
*G11C 29/44* (2006.01)

(52) U.S. Cl.
CPC ........ *G11C 29/42* (2013.01); *G11C 29/12015* (2013.01); *G11C 29/18* (2013.01); *G11C 29/4401* (2013.01)

(58) Field of Classification Search
CPC ... G11C 29/42; G11C 29/12015; G11C 29/18; G11C 29/4401
See application file for complete search history.

(56) References Cited

U.S. PATENT DOCUMENTS

| 4,873,630 | A | * | 10/1989 | Rusterholz | .......... | G06F 9/30018 |
| | | | | | | 712/E9.071 |
| 6,118,724 | A | * | 9/2000 | Higginbottom | ...... | G11C 7/1051 |
| | | | | | | 365/230.02 |
| 2004/0006674 | A1 | | 1/2004 | Hargis et al. | | |
| 2008/0181018 | A1 | | 7/2008 | Nagadomi et al. | | |

(Continued)

FOREIGN PATENT DOCUMENTS

JP 2013196068 A 9/2013

OTHER PUBLICATIONS

Wikipedia, "Error detection and correction," retrieved Aug. 18, 2020, 10 pages.

*Primary Examiner* — Tuan T Nguyen
(74) *Attorney, Agent, or Firm* — Slater Matsil, LLP

(57) ABSTRACT

A device includes a set of processing circuits arranged in subsets, a set of data memory banks coupled to a memory controller, a control unit, and an interconnect network. The processing circuits are configurable to read first input data from the data memory banks via the interconnect network and the memory controller, process the first input data to produce output data, and write the output data into the data memory banks via the interconnect network and the memory controller. The hardware accelerator device includes a set of configurable lock-step control units which interface the processing circuits to the interconnect network. Each configurable lock-step control unit is coupled to a subset of processing circuits and is selectively activatable to operate in a first operation mode, or in a second operation mode.

20 Claims, 6 Drawing Sheets

(56) References Cited

U.S. PATENT DOCUMENTS

| | | | |
|---|---|---|---|
| 2012/0131257 A1* | 5/2012 | Rudosky | H03K 19/17796 |
| | | | 711/170 |
| 2012/0131288 A1* | 5/2012 | Box | G06F 12/0646 |
| | | | 711/E12.001 |
| 2016/0283314 A1 | 9/2016 | Thanner et al. | |
| 2020/0333982 A1 | 10/2020 | Lee | |

* cited by examiner

HARDWARE ACCELERATOR DEVICE, CORRESPONDING SYSTEM AND METHOD OF OPERATION

CROSS-REFERENCE TO RELATED APPLICATIONS

This application claims priority to Italian Patent Application No. 102020000029759, filed on Dec. 3, 2020, which application is hereby incorporated by reference herein in its entirety.

TECHNICAL FIELD

The present disclosure generally relates to hardware accelerators and, in particular embodiments, to automotive-grade hardware accelerators to speed up complex data processing algorithms.

BACKGROUND

Real-time digital signal processing systems may involve processing a relevant amount of data per unit of time. For instance, such systems may be used for processing video data, image data, radar data, wireless communication data, or a combination thereof, as increasingly demanded in the automotive field. In various applications, such processing may turn out to be highly demanding for purely core-based implementations (i.e., implementations involving general-purpose microprocessors or microcontrollers running a processing software).

Therefore, the use of hardware accelerators is becoming increasingly relevant in certain fields of data processing since it facilitates speeding up the computation of certain algorithms. Properly designed hardware accelerators may reduce the processing time of specific operations compared to core-based implementations.

In particular, there is an increasing interest in the automotive field towards using hardware accelerators to implement passive or active safety systems, which may prevent or reduce the harm to the driver and the passenger(s) of a vehicle. Such safety systems may include, purely by way of example, modern systems like forward collision warning, blind-spot monitoring, and automatic emergency braking, as well as more conventional systems like airbags, anti-lock braking systems (ABSs), and others.

Safety-critical electronic components for use in the automotive field may be subject to certain safety requirements (e.g., according to the safety standard ISO 26262). The ISO 26262 standard provides a common means to measure and document the safety level of electrical and electronics (E/E) systems, which can be classified according to certain Automotive Safety Integrity Levels (ASIL) (e.g., from ASIL-A (which satisfies fewer safety requirements) to ASIL-D), which satisfies more safety requirements.

Therefore, it would be advantageous to provide automotive-grade hardware accelerators designed to speed up certain complex data processing algorithms—such as Fast Fourier Transform (FFT), Finite Impulse Response (FIR) filters, Artificial Neural Networks (ANN), and others, which are increasingly used in modern Advanced Driver Assistance Systems (ADAS) to, for example, comply with certain safety requirements (e.g., the ASIL-D requirements of the ISO 26262 standard).

In the field of hardware accelerators (e.g., implemented in a system-on-chip (SoC)), functional safety may be implemented by duplicating the internal hardware resources according to a conventional lock-step configuration, which may turn out to increase the silicon area occupation, the power consumption, or both, of the hardware accelerator, especially in the case of a complex hardware accelerator.

SUMMARY

An object of one or more embodiments is providing a hardware accelerator device that solves one or more of the drawbacks mentioned above.

According to one or more embodiments, such an object can be achieved by a hardware accelerator device having the features set forth in the claims that follow.

One or more embodiments may relate to a corresponding system (e.g., a system-on-chip integrated circuit comprising a hardware accelerator device). One or more embodiments may relate to a corresponding method of operation.

According to one or more embodiments, it is provided a hardware accelerator device which may include a set of processing circuits arranged in subsets (e.g., in pairs) of processing circuits, a set of data memory banks coupled to a memory controller, a control unit including configuration registers providing storing space for configuration data of the processing circuits, and an interconnect network.

The processing circuits may be configured as a function of the configuration data to read first input data from the data memory banks via the interconnect network and the memory controller, process the first input data to produce output data, and write the output data into the data memory banks via the interconnect network and the memory controller.

The hardware accelerator device may include a set of configurable lock-step control units, which interface the processing circuits to the interconnect network.

Each configurable lock-step control unit in the set of configurable lock-step control units may be coupled to a subset of processing circuits in the set of processing circuits.

Each configurable lock-step control unit may be selectively activated to operate in: a first operation mode, wherein the lock-step control unit is configured to compare data read requests, data write requests, or both, issued towards the memory controller by a first processing circuit and a second processing circuit in the respective subset of processing circuits to detect a fault, or a second operation mode, wherein the lock-step control unit is configured to propagate towards the memory controller the data read requests, data write requests, or both, issued by the first processing circuit and by the second processing circuit in the respective subset of processing circuits.

Therefore, one or more embodiments may provide a memory-based hardware accelerator device (e.g., Enhanced Data Processing Architecture (EDPA)) comprising a safety architecture that facilitates configuring (statically, dynamically, or both) the memory-based hardware accelerator device in terms of ASIL-X grade (e.g., ASIL-B, ASIL-C, ASIL-D).

According to one or more embodiments, a memory-based hardware accelerator device may be used for speeding up the computation of certain safety-relevant data processing algorithms, like the ones adopted in modern advanced driver assistance systems or other safety-critical applications.

For instance, one or more embodiments may find application in real-time processing systems that accelerate computationally demanding operations (e.g., vector/matrix product, convolution, FFT, radix-2 butterfly algorithm, multiplication of complex vectors, trigonometric, exponential, or logarithmic function, etc.).

One or more embodiments aim at providing a certain functional safety level (e.g., ASIL-D level) without relying on the duplication of the hardware resources in the hardware accelerator device. One or more embodiments may thus improve the trade-off between silicon area occupation and the performance of the hardware accelerator.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals, and a corresponding description will not be repeated for brevity.

The references used herein are provided merely for convenience and hence do not define the extent of protection or the scope of the embodiments.

By way of introduction to the detailed description of exemplary embodiments, reference is made to the disclosures of the Italian patent applications indicated in the following and filed by the same Applicant (and not yet available to the public at the time of filing of the instant application), the content of which is hereby incorporated by reference in its entirety: Italian Pat. Appl. No. 102020000009358 filed on Apr. 29, 2020, which in brief discloses a hardware accelerator device comprising a set of (run-time) configurable processing circuits, a set of data memory banks, and a control unit, wherein the configurable processing circuits are configurable to read data from and write data into the data memory banks via an interconnect network as a function of configuration data received from the control unit; Italian Pat. Appl. No. 102020000009364 filed on Apr. 29, 2020, which in brief discloses a method of accessing memory by supporting vector accesses with a programmable stride and memory access scheme to the memory, the method being applicable to a hardware accelerator device comprising a set of processing circuits; and Italian Pat. Appl. No. 102020000016393 filed on Jul. 7, 2020, which in brief discloses a method of storing and fetching twiddle factors in a memory of a hardware accelerator device for efficient computation of a Fast Fourier Transform algorithm.

Figure 1:
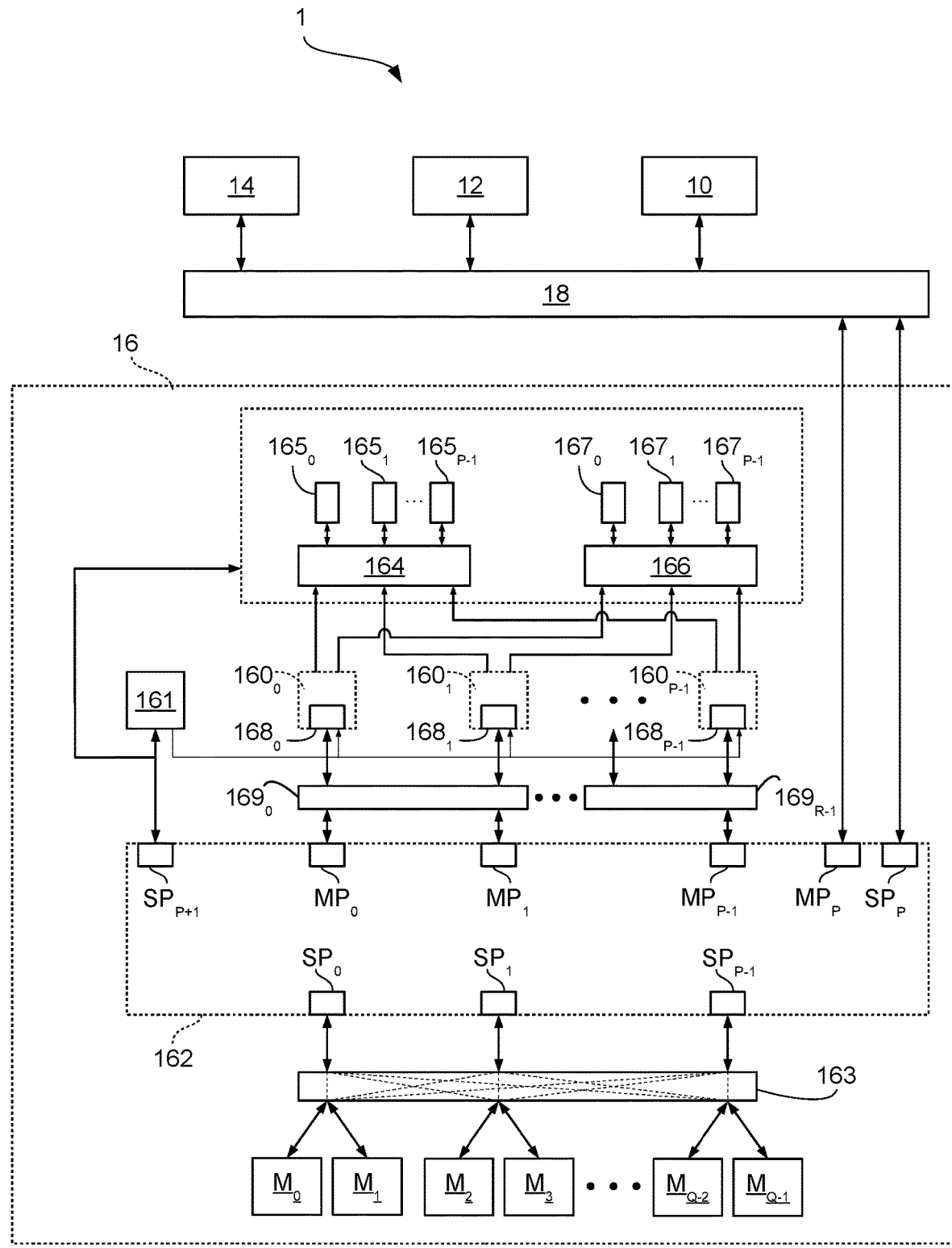
FIG. 1 is a block diagram of an embodiment electronic system.

FIG. 1 exemplifies an electronic system 1 according to one or more embodiments, such as a system-on-chip (SoC). The electronic system 1 may include various electronic circuits such as, for instance: a central processing unit 10 (CPU, e.g., a microprocessor), a main system memory 12 (e.g., a system RAM—Random Access Memory), a direct memory access (DMA) controller 14, and a hardware accelerator device 16.

The hardware accelerator device 16 may be designed to support execution of (basic) arithmetic functions. The electronic circuits in the electronic system 1 may be connected by a system interconnect network 18 (e.g., a SoC interconnect).

As exemplified in FIG. 1, a hardware accelerator device 16 may include a plurality of processing elements comprising a number P of processing elements $160_o, 160_1, \ldots, 160_{P-1}$, (also collectively designated with reference numeral 160 in the present description), and a set of local data memory banks, optionally a number Q=2*P of local data memory banks $M_o, \ldots, M_{Q-1}$ (also collectively designated with reference M in the present description).

The hardware accelerator device 16 may further include a local control unit 161, a local interconnect network 162, a local data memory controller 163, a local ROM controller 164 coupled to a set of local read-only memories, optionally a number P of local read-only memories $165_o, 165_1, \ldots, 165_{P-1}$ (also collectively designated with reference numeral 165 in the present description), and a local configuration memory controller 166 coupled to a set of local configurable coefficient memories, and optionally a number P of local configurable coefficient memories $167_o, 167_1, \ldots, 167_{P-1}$ (also collectively designated with reference numeral 167 in the present description). The memories 167 may include volatile memories (e.g., RAM memories) and/or non-volatile memories (e.g., PCM memories).

Different embodiments may include a different number P of processing elements 160 and/or a different number Q of local data memory banks M. By way of example, P may be equal to 8 and Q may be equal to 16.

The processing elements 160 may support (e.g., based on a proper static configuration) different processing functions (e.g., floating-point single precision 32 bits, fixed-point/integer 32 bits, or 16 or 8 bits with parallel computation or vectored mode).

The processing elements 160 may include respective internal direct memory access (DMA) controllers $168_o, 168_1, \ldots, 168_{P-1}$ (also collectively designated with reference numeral 168 in the present description). The processing elements 160 may be configured to retrieve input data from the local data memory banks M and/or from the main system memory 12 through the respective direct memory access controllers 168. The processing elements 160 may thus process the retrieved input data to generate output data. The processing elements 160 may be configured to store the processed output data in the local data memory banks M and/or in the main system memory 12 via the respective direct memory access controllers 168.

Additionally, the processing elements 160 may be configured to retrieve input data from the local read-only memories 165 and/or from the local configurable coefficient memories 167 to perform such elaboration.

Providing a set of local data memory banks M may facilitate processing data in parallel and reducing memory access conflicts. The local data memory banks M may be provided with buffering (e.g., double buffering), which may facilitate recovering the memory upload time (write operation) and/or download time (read operation).

In embodiments, each local data memory bank may be duplicated so that data can be read (e.g., for being processed) from one of the two memory banks, and (new) data can be stored (e.g., for being processed later) in the other memory bank at the same time. As a result, moving data may not negatively affect computation performances, as it may be masked. A double buffering scheme of the local data memory banks M may be advantageous in combination with data processing in streaming mode or back to back (e.g., as applicable to an FFT N-point processor that is configured to elaborate continuous sequences of N data inputs).

The local control unit 161 may include a register file including information for setting up the configuration of the processing elements 160. For instance, the local control unit 161 may set up the processing elements 160 to perform a specific algorithm as directed by a host application running on the central processing unit 10. In one or more embodiments, the local control unit 161 may thus configure (e.g., dynamically) each of the processing elements 160 for computing a specific (basic) function and may configure each of the respective internal direct memory access controllers 168 with a specific memory access scheme and loop cycle.

The local interconnect network 162 may include a low complexity interconnect system, e.g., based on a bus network of a known type such as an AXI4-based interconnect. For instance, the data parallelism of the local interconnect network 162 may be on 64 bits, and the address width may be 32 bits.

The local interconnect network 162 may be configured to connect the processing elements 160 to the local data memory banks M and/or to the main system memory 12. Additionally, the local interconnect network 162 may be configured to connect the local control unit 161, and the local configuration memory controller 166 to the system interconnect network 18.

In embodiments, the interconnect network 162 may include: a set of P master ports $MP_o$, $MP_1$, ..., $MP_{P-1}$ (also collectively designated with reference MP in the present description), each of these master ports being couplable to a respective processing element 160; a set of P slave ports $SP_o$, $SP_1$, ..., $SP_{P-1}$ (also collectively designated with reference SP in the present description), each of these slave ports being couplable via the local data memory controller 163 to the local data memory banks M; a further pair of ports comprising a system master port $MP_P$ and a system slave port $SP_P$ configured for coupling to the system interconnect network 18 (e.g., to receive instructions from the central processing unit 10 and/or to access data stored in the system memory 12); and a still further slave port $SP_P$, coupled to the local control unit 161 and to the local configuration memory controller 166.

In one or more embodiments, the interconnect network 162 may be fixed (i.e., not reconfigurable).

In an exemplary embodiment (see, e.g., Table I provided at the end of the description, where an "X" sign indicates an existing connection between two ports), the interconnect network 162 may implement the following connections: each of the P master ports $MP_o$, $MP_1$, ..., $MP_{P-1}$ coupled to a processing element 160 may be connected to a respective slave port $SP_o$, $SP_1$, ..., $SP_P$, coupled to the local data memory controller 163; and the system master port $MP_P$ coupled to the system interconnect network 18 may be connected to the slave port $SP_P$, coupled to the local control unit 161 and the local configuration memory controller 166.

In another exemplary embodiment (see, e.g., Table II provided at the end of the description, where an "X" sign indicates an existing connection between two ports), the interconnect network 162 may further implement the following connections: each of the P master ports $MP_o$, $MP_1$, ..., $MP_{P-1}$ may be connected to the system slave port $SP_P$ coupled to the system interconnect network 18. In this way, connectivity may be provided between any processing element 160 and the SoC via the system interconnect network 18.

In another exemplary embodiment (see, e.g., Table III provided at the end of the description, where an "X" sign indicates an existing connection between two ports, and an "X" between parentheses indicates an optional connection), the interconnect network 162 may further implement the following connection: the system master port $MP_P$ coupled to the system interconnect network 18 may be connected to at least one of the slave ports $SP_o$, $SP_1$, ..., $SP_{P-1}$ (here, the first slave port $SP_o$ in the set of P slave ports $SP_o$, $SP_1$, ..., $SP_{P-1}$). In this way, the connection may be provided between the master port $MP_P$ and (any) slave. According to the specific application of system 1, the master port $MP_P$ connection may be extended to a plurality of (e.g., all) the slave ports $SP_o$, $SP_1$, ..., $SP_{P-1}$. Connection of the master port $MP_P$ to at least one of the slave ports $SP_o$, $SP_1$, ..., $SP_{P-1}$ may be used (only) to load the input data to be processed into the local data memory banks $M_o$, ..., $M_{Q-1}$ insofar as all memory banks may be accessed via a single slave port. Loading input data can be done using only one slave port, while processing the data by parallel computation may take advantage of using a plurality (e.g., all) of the slave ports $SP_o$, $SP_1$, ..., $SP_{P-1}$.

In one or more embodiments, the local data memory controller 163 may be configured to arbitrate access (e.g., by the processing elements 160) to the local data memory banks M. For instance, the local data memory controller 163 may use memory access schemes selectable as a function of a signal received from the local control unit 161 (e.g., for computation of a specific algorithm).

In one or more embodiments, the local data memory controller 163 may translate input read/write transaction bursts (e.g., AXI bursts) generated by the read/write direct memory access controllers 168 into a sequence of read/write memory accesses, according to a specified burst type, burst length, and memory access scheme.

In one or more embodiments, the local read-only memories 165 accessible by the processing elements 160 via the local ROM controller 164 may be configured to store numeric factors and/or fixed coefficients for implementation of specific algorithms or operations (for instance, twiddle factors for FFT computation or other complex coefficients). The local ROM controller 164 may implement specific address schemes.

In one or more embodiments, the local configurable coefficient memories 167 accessible by the processing elements 160 via the local configuration memory controller 166 may be configured to store application-dependent numeric factors and/or coefficients which can be configured by software (for instance, coefficients for implementing a FIR filter or a beamforming operation, weights of a neural network, etc.). The local configuration memory controller 166 may implement specific address schemes.

In one or more embodiments, the local read-only memories 165 and/or the local configurable coefficient memories 167 may advantageously be split into a number P of banks equal to the number of processing elements 160 included in the hardware accelerator device 16. This may facilitate avoiding conflicts during parallel computations.

Figure 2:
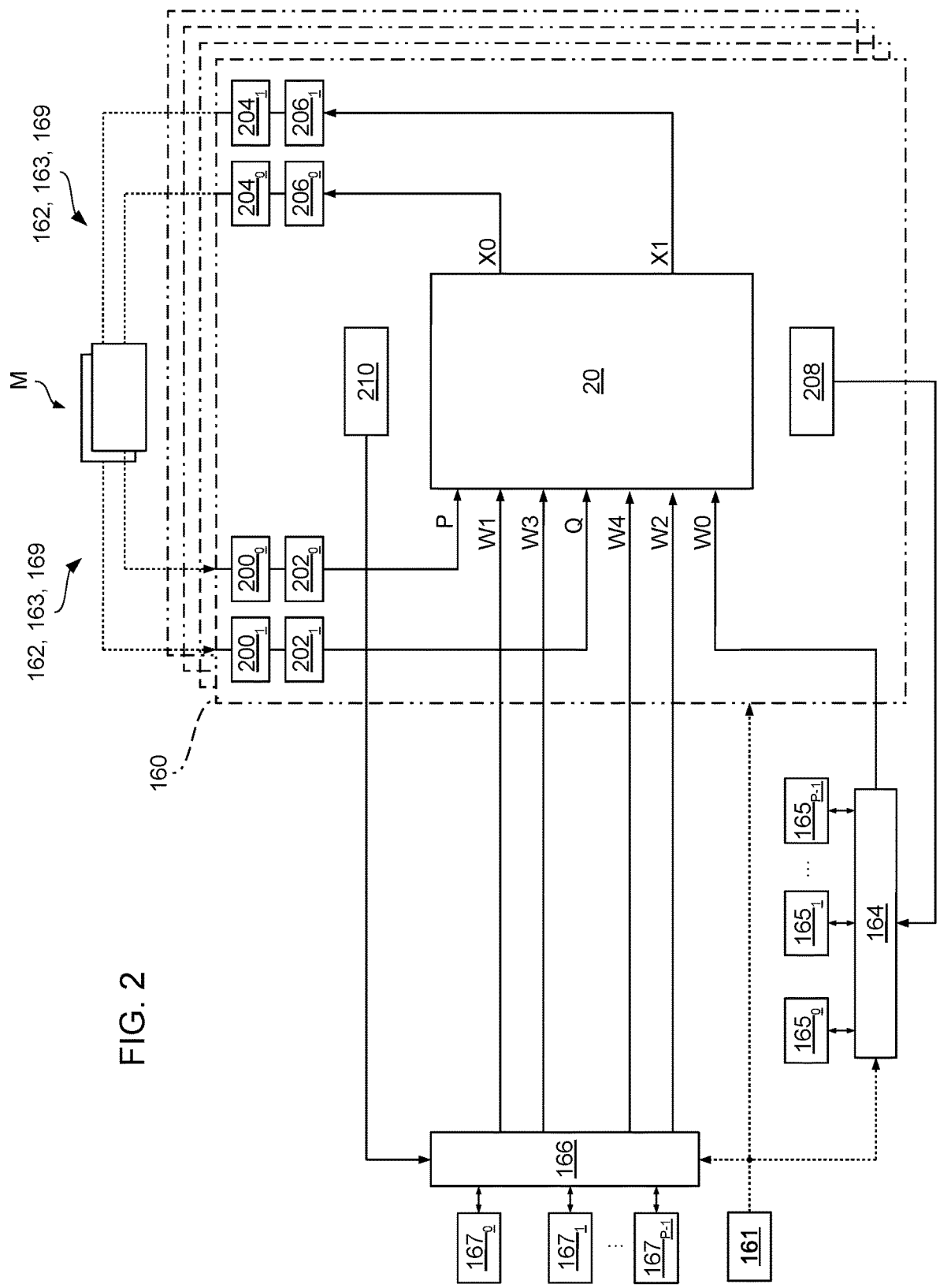
FIG. 2 is a block diagram of an embodiment electronic device implementing a hardware accelerator.

FIG. 2 is a circuit block diagram of an embodiment processing element 160 and related connections to the local ROM controller 164, the local configuration memory controller 166, and the local data memory banks M (with the dotted lines schematically indicating a reconfigurable connection between the processing element 160 and the local data memory banks M via the local interconnect network 162 and the local data memory controller 163).

A processing element 160, as exemplified in FIG. 2, may be configured to receive: a first input signal P (e.g., a digital signal indicative of a binary value from a local data memory bank M) via a respective read direct memory access $200_o$ and a buffer register $202_o$ (e.g., a FIFO register); a second input signal Q (e.g., a digital signal indicative of a binary value from a local data memory bank M) via a respective read direct memory access $200_1$ and a buffer register $202_1$ (e.g., a FIFO register); a first input coefficient $W_o$ (e.g., a digital signal indicative of a binary value from a local read-only memory 165); and a second, a third, a fourth and a fifth input coefficients $W_1$, $W_2$, $W_3$, $W_4$ (e.g., digital signals indicative of respective binary values from a local configurable coefficient memory 167).

In one or more embodiments, a processing element 160 may include a number of read direct memory access 200 equal to the number of input signals P, Q.

It will be understood that the number of input signals and/or input coefficients received at the processing element 160 may vary in different embodiments.

The processing element 160 may include a computing circuit 20 configurable (possibly at run-time) to process the input values P, Q and the input coefficients $W_o$, $W_1$, $W_2$, $W_3$, $W_4$ to produce a first output signal Xo (e.g., a digital signal indicative of a binary value to be stored in a local data memory bank M via a respective write direct memory access $204_o$ and buffer register $206_o$ such as a FIFO register) and a second output signal Xi (e.g., a digital signal indicative of a binary value to be stored in a local data memory bank M via a respective write direct memory access $204_1$ and buffer register $206_1$ such as a FIFO register).

In one or more embodiments, a processing element 160 may include a number of write direct memory access 204 equal to the number of output signals Xo, Xi.

In one or more embodiments, programming of the read and/or write direct memory access 200, 204 (which may be included in the direct memory access controllers 168) may be performed via an interface (e.g., an AMBA interface), which may allow to access internal control registers located in the local control unit 161.

Additionally, a processing element 160 may include a ROM address generator circuit 208 coupled to the local ROM controller 164 and a memory address generator circuit 210 coupled to the local configuration memory controller 166 to manage data retrieval therefrom.

A computing circuit 20 may include a set of (e.g., highly parallelized) processing resources including, for instance, four complex/real multiplier circuits, two complex adder-subtractor circuits, two accumulator circuits, and two activation non-linear function circuits, reconfigurably couplable (e.g., by multiplexers) to form different datapaths, with different datapaths corresponding to different mathematical operations.

Regarding FIG. 1 again, one or more embodiments of a hardware accelerator device 16 may include a plurality of read/write lock-step units, e.g., a number R=P/2 of lock-step units $169_o$, . . . , $169_{R-1}$ (also collectively designated with reference numeral 169 in the present description).

In embodiments, in one or more embodiments, each lock-step unit 169 may be configured to couple a pair of processing elements 160 to the interconnect network 162. For instance, as exemplified in FIG. 1, a first lock-step unit $169_o$ may be coupled to the DMA controllers $168_o$ and $168_1$ of a first processing element $160_o$ and a second processing element $160_1$, and a last lock-step unit $169_{R-1}$ may be coupled to the DMA controllers $168_{P-1}$ and $168_{P-2}$ of a last processing element $160_{P-1}$ and a second-to-last processing element $160_{P-2}$.

Each lock-step unit 169 may be selectively configured (e.g., by setting a register of the local control unit 161) to pass data between the respective processing elements and the interconnect network so that the processing elements in the respective pair may operate according to two different operation modes: in a first mode ("pseudo-lockstep mode"), the two processing elements operate in parallel, with a first processing element in the pair operating as a "functional" circuit and a second processing element in the pair operating as a "shadow" circuit which replicates the operations performed by the functional circuit, so that safety-relevant algorithms may be computed with a target level of functional safety (e.g., the ASIL-D level); and in a second mode ("high speed mode"), the two processing elements operate independently one from the other, as directed by the control unit 161, so that non-safety-relevant algorithms may be computed at a higher speed, provided that ASIL-D safety requirements are not expected to be met.

Therefore, a "functional" computation path and a "shadow" computation path may be dynamically configurable for a specific scheme/algorithm, for each pair of processing elements 160 in the hardware accelerator device 16, when high functional safety is demanded.

Figure 3:
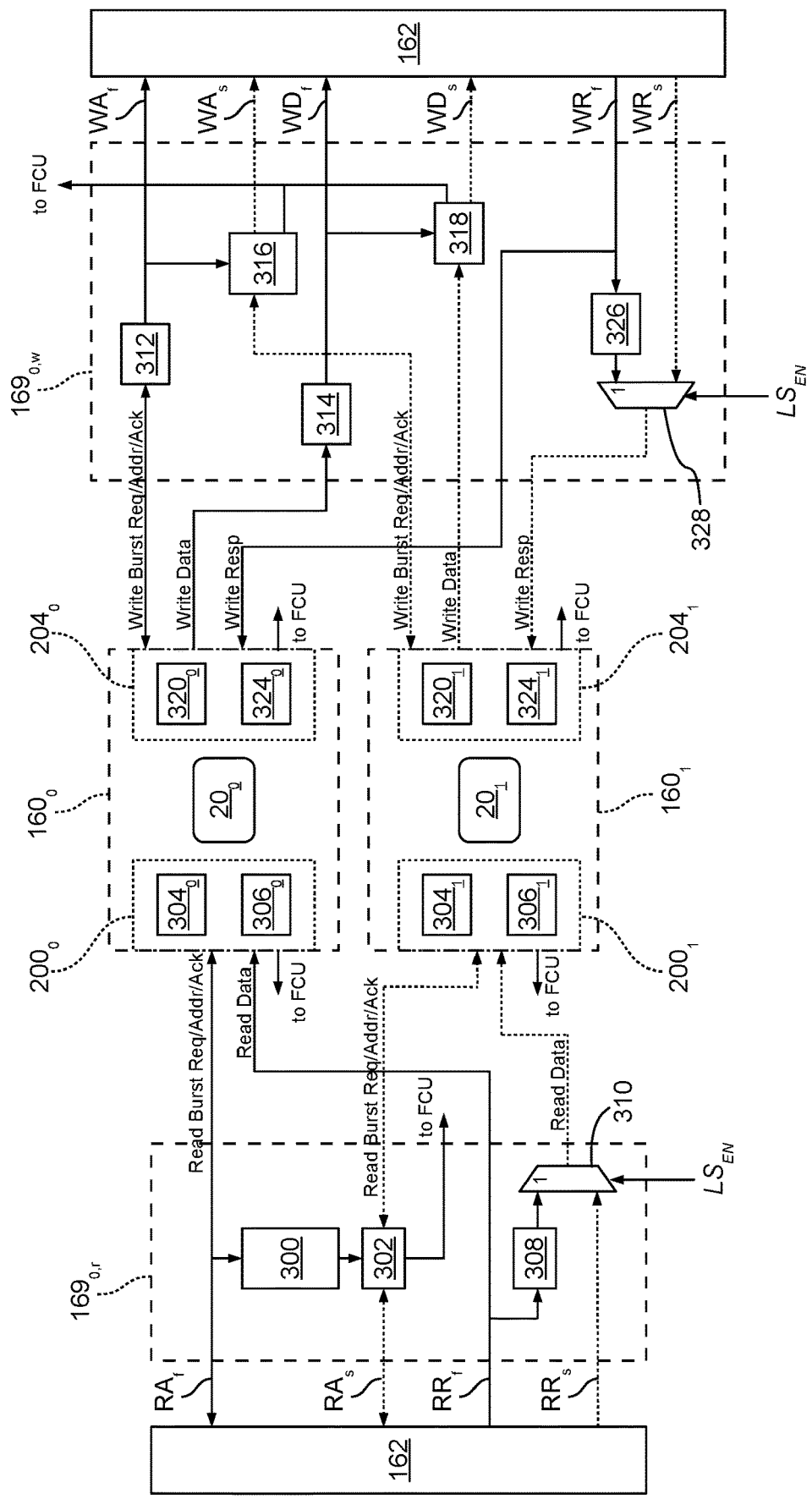
FIG. 3 is a block diagram of an embodiment lock-step architecture for use in a hardware accelerator.

FIG. 3 is a circuit block diagram of an embodiment pair of processing elements $160_o$, $160_1$ coupled to the interconnect network 162 by a read lock-step unit $169_{o,r}$ and a write lock-step unit $169_{o,w}$. It will be understood that the read and write portions of the lock-step unit $169_o$ are illustrated as separate circuit blocks for the sake of clarity only and that in one or more embodiments, the read and write portions of a lock-step unit 169 may be implemented in a single circuit. The same applies to the interconnect network 162, which is illustrated in FIG. 3 with two separate blocks for the sake of clarity only.

As exemplified in FIG. 3, a hardware accelerator 16 according to one or more embodiments may thus include: at least one pair of processing elements $160_o$, $160_1$ configurable to support two redundant paths (functional and shadow) for the data processing, an interconnect network 162 configured to support data routing from/to the functional and shadow processing elements, and a read lock-step unit $169_{o,r}$ and write lock-step unit $169_{o,w}$ for each pair of processing elements (functional and shadow), the lock-step units being configured to check and/or protect the data delivery (end to end) from/to the local memories M and/or the system memory 12 via the local interconnect network 162.

In one or more embodiments, the functional path (exemplified by the solid lines in FIG. 3) is related to the main one where the interconnect accesses are performed, while the shadow path (exemplified by the dashed lines in FIG. 3) is related to the redundant one, where the interconnect accesses are gated in lock-step mode.

By way of example, the read lock-step unit $169_{o,r}$ may provide a functional read address channel $RA_f$ between the interconnect network 162 and the first processing element $160_o$ and a shadow read address channel $RA_s$ between the interconnect network 162 and the second processing element $160_1$ (Read Burst Req/Addr/Ack). The read lock-step unit $169_{o,r}$ may also provide a functional read response channel $RR_f$ between the interconnect network 162 and the first processing element $160_o$ and a shadow read response channel $RR_s$ between the interconnect network 162 and the second processing element $160_1$ (Read Data).

Still, by way of example, the write lock-step unit $169_{o,w}$ may provide a functional write address channel $WA_f$ between the interconnect network 162 and the first processing element $160_o$ and a shadow write address channel $WA_s$ between the interconnect network 162 and the second processing element $160_1$ (Write Burst Req/Addr/Ack). The write lock-step unit $169_{o,w}$ may also provide a functional write data channel $WD_f$ between the interconnect network 162 and the first processing element $160_o$, and a shadow write data channel $WD_s$ between the interconnect network 162 and the second processing element $160_1$ (Write Data). The write lock step unit $169_{o,w}$ may also provide a functional write response channel $WR_f$ between the interconnect network 162 and the first processing element $160_o$, and a shadow write response channel $WR_s$ between the interconnect network 162 and the second processing element $160_1$ (Write Resp).

As exemplified in FIG. 3, a read lock-step unit $169_{o,r}$ may include: a circular buffer circuit 300 coupled to the functional read address channel $RA_f$, a comparator and gating circuit 302 coupled to the output of the circular buffer circuit 300 and the shadow read address channel $RA_s$, a delay-generating circuit 308 coupled to the functional read response channel RR/and configured to generate delayed replicas of the read response (data channel) on the functional read response channel $RR_f$, and a multiplexer or gating circuit 310 coupled to the output of the delay-generating circuit 308 and to the shadow read response channel $RR_s$, and controlled by a lock-step enable signal $LS_{EN}$.

In one or more embodiments, the circular buffer circuit 300 may be configured to buffer, in lock-step mode, the read requests (address channel, control channel) on the functional read address channel $RA_f$. The control logic of the circular buffer circuit 300 may be based on a simple handshake mechanism, request, and acknowledge, which allows supporting most of the communication protocols, such as the AXI protocol. A new read request (address channel, control channel) can be buffered to be compared later (only) when an entry is still available, otherwise, the acknowledge signal may be kept low, waiting for an entry to become free. An entry becomes free (only) due to a read request arriving from the processing element $160_1$. The data comparison may take place in the comparator circuit 302 between the read request from $160_1$ and the first entry of buffer 300. All buffer entries (one entry per request) are shifted by one position at the next clock cycle. The circular buffer circuit 300 may not be enabled in high-speed mode, and no read request is stored inside the buffer.

In one or more embodiments, the comparator and gating circuit 302 may be configured to compare, in lock-step mode, the read requests (address channel, control channel) between the functional read address channel $RA_f$ stored inside the buffer 300, and the shadow read address channel $RA_s$, and to gate the request on the shadow read address channel $RA_s$ to the interconnect 162 which must not be propagated. As a result of the lock-step mode not being active, the comparator and gating circuit 302 may propagate the request on the shadow read address channel $RA_s$ to the local interconnect 162, and data comparison may not take place.

In one or more embodiments, the read lock-step unit $169_{o,r}$ may be configured to signal faults to a fault collection unit (FCU) in case of failures detected by the comparator and gating circuit 302.

In one or more embodiments, the multiplexer or gating circuit 310 may propagate to the processing element $160_1$ the delayed response coming from the functional read response channel $RR_f$ (output of the delay-generating circuit 308) as a result of the lock-step mode being enabled (e.g., $LS_{EN}$=1). Otherwise, as a result of the lock-step mode being disabled (e.g., $LS_{EN}$=0), the multiplexer or gating circuit 310 may propagate to the processing element $160_1$ the response on the shadow read response channel $RR_s$.

As exemplified in FIG. 3, a write lock-step unit $169_{o,w}$ may include: a first circular buffer circuit 312 coupled to the functional write address channel $WA_f$, a second circular buffer circuit 314 coupled to the functional write data channel $WD_f$, a first comparator, and gating circuit 316 coupled to the output of the first circular buffer circuit 312 and to the shadow write address channel $WA_s$, a second comparator and gating circuit 318 coupled to the output of the second circular buffer circuit 314 and to the shadow write data channel $WD_s$, a delay-generating circuit 326 coupled to the functional write response channel $WR_f$ and configured to generate delayed replicas of the write response (data channel) on the functional write response channel $WR_f$, and a multiplexer or gating circuit 328 coupled to the output of the delay-generating circuit 326 and to the shadow write response channel $WR_s$, and controlled by a lock-step enable signal $LS_{EN}$.

In one or more embodiments, the first circular buffer circuit 312 may be configured to buffer, in lock-step mode, the write requests (address channel, control channel) on the functional write address channel $WA_f$. The control logic of the first circular buffer circuit 312 may be based on a simple handshake mechanism, request and acknowledge, which allows supporting most of the communication protocols, such as the AXI protocol. A new write request (address channel, control channel) can be buffered to be compared later (only) when an entry is still available, otherwise, the acknowledge signal may be kept low, waiting for an entry to become free. An entry becomes free (only) due to a write request arriving from the processing element $160_1$. The data comparison may take place in the comparator circuit 316 between the write request from $160_1$ and the first entry of the buffer 312. All buffer entries (one entry per request) are shifted by one position at the next clock cycle. In high-speed mode, the first circular buffer circuit 312 may not be enabled, so that write requests are not stored inside the buffer 312 and can be directly propagated to the local interconnect 162.

In one or more embodiments, the first comparator and gating circuit 316 may be configured to compare, in lock-step mode, the write requests (address channel, control channel) between the functional write address channel $WA_f$, stored inside the buffer 312, and the shadow write address channel $WA_s$, and to gate the request on the shadow write address channel WA to the interconnect 162 which must not be propagated. As a result of the lock-step mode not being active, the first comparator and gating circuit 316 may propagate the request on the shadow write address channel $WA_s$ to the local interconnect 162, and data comparison may not take place.

In one or more embodiments, the second circular buffer circuit 314 may be configured to buffer, in lock-step mode, the write requests (data channel) on the functional write data channel $WD_f$. The control logic of the second circular buffer circuit 314 may be based on a simple handshake mechanism, request and acknowledge, which allows supporting most of the communication protocols, such as the AXI protocol. A new write request (data channel) can be buffered to be compared later (only) when an entry is still available, otherwise, the acknowledge signal may be kept low, waiting for an entry to become free. An entry becomes free (only) due to a write request arriving from the processing element $160_1$. The data comparison may take place in the comparator circuit 318 between the write request from $160_1$ and the first entry of the buffer 314. All buffer entries (one entry per request) are shifted by one position at the next clock cycle. In high-speed mode, the second circular buffer circuit 314 may not be enabled so that write requests are not stored inside the buffer 314 and can be directly propagated to the local interconnect 162.

In one or more embodiments, the second comparator and gating circuit 318 may be configured to compare, in lock-step mode, the write requests (data channel) between the functional write data channel $WD_f$, stored inside the buffer 314, the shadow write data channel $WD_s$, and to gate the request on the shadow write data channel $WD_s$, to the interconnect 162, which must not be propagated. As a result of the lock-step mode not being active, the second comparator and gating circuit 318 may propagate the request on the shadow write data channel $WD_s$, to the local interconnect 162, and data comparison may not take place.

In one or more embodiments, the write lock-step unit $169_{o,w}$ may be configured to signal faults to a fault collection unit in case of failures detected by the comparator and gating circuits 316 and/or 318. Additionally or alternatively, the comparator and gating circuits 316 and/or 318 may be configured to gate the write accesses on the functional paths $WA_f$ and $WD_f$ in order to avoid corrupting the memory content in case of a detected failure.

Therefore, in one or more embodiments, the functional read accesses may be immediately propagated to the interconnect network 162 without waiting for a comparison to take place in the comparator circuit 302, while the functional write accesses may be propagated to the interconnect network 162 only after a comparison has taken place in the comparator circuits 316 and/or 318, insofar as erroneous write access may corrupt the data stored in the memory.

In one or more embodiments, each pair of processing elements 160 (statically defined within the hardware accelerator device 16) can be programmed to operate according to the pseudo-lockstep mode by setting a respective configuration bit in the configuration registers of the control unit 161, when the hardware accelerator device 16 is used for safety-relevant applications. For instance, if such configuration bit has a first value (e.g., it is equal to 1), the read/write comparator circuits 302, 316, 318 may perform a comparison on the DMA read/write output channels. In response to a mismatch being detected, the corresponding write request may not be propagated, the flow may be stalled, and an error may be reported to a (e.g., external) logic fault collection unit (LFCU) of the system-on-chip 1. Alternatively, if such configuration bit has a second value (e.g., it is equal to 0), the requests on the bus may be simply propagated to the memory controller 163.

In one or more embodiments, when two processing elements in a pair (i.e., a "functional" processing element 160, and a "shadow" processing element $160_1$) operate in pseudo-lockstep mode, their operation may be time-shifted (e.g., out of phase). For instance, such a time shift may be equal to a certain number of clock cycles, optionally two clock cycles. This may be obtained, for example, by a hardware architecture, as exemplified in FIG. 4.

In one or more embodiments, the phase shift mechanism may be the same for all internal DMA controllers, e.g., both read DMA controllers and write DMA controllers. Such a time shift may facilitate reaching good coverage against common cause failures. For instance, a fault due to electromagnetic interference (EMI) may result in a failure equal for both the functional path and the shadow path, which would not be detectable by the lock-step unit without a time shift.

Figure 4:
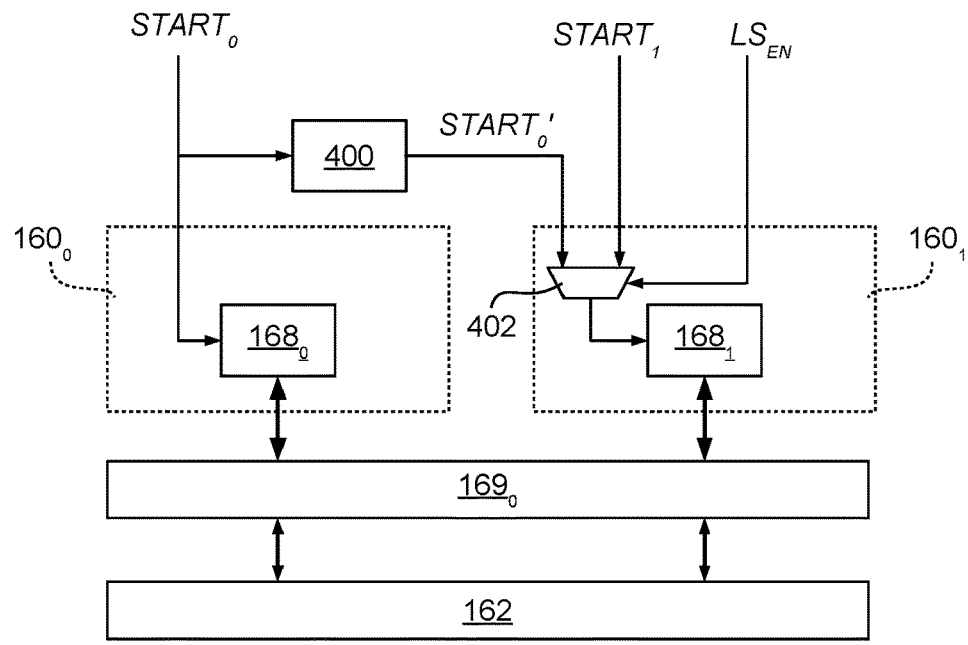
FIG. 4 is a block diagram of an embodiment phase shift generating circuit for use in a hardware accelerator.

As exemplified in FIG. 4, the DMA controller $168_o$ (read and/or write) of a processing element $160_o$ configured as a functional processing element of a pair may receive a start signal $START_o$ from the control unit 161. The DMA controller $168_1$ (read and/or write) of a processing element $160_1$ configured as a shadow processing element of the pair may receive either a delayed replica $START_o'$ of the start signal $START_o$, as a result of the pseudo-lockstep mode being enabled (e.g., $LS_{EN}=1$), or a start signal $START_1$ from the control unit 161, as a result of the high-speed mode being enabled (e.g., $LS_{EN}=0$). A delay generating circuit block 400 may receive the start signal $START_o$ and generate the delayed replica $START_o'$. A selection circuit 402 (e.g., a multiplexer or a gating circuit) may propagate the delayed replica $START_o'$ or the start signal $START_1$ to the DMA controller 168, as a function of a pseudo-lockstep enable signal $LS_{EN}$.

In one or more embodiments, when two processing elements in a pair operate in high-speed mode, the read/write lock-step units 169 can be configured as a basic safety mechanism (without the lock-step comparators, i.e., providing two independent data paths) to protect (only) the data delivery (end to end) to/from the local memories M via the local interconnect 162.

In one or more embodiments, the hardware accelerator device 16 may support the concurrent execution of plural algorithms. In that case, the corresponding pairs of processing elements can be configured to operate in pseudo-lockstep mode or high-speed mode according to the safety requirements of the specific algorithm. In embodiments, a subset of pairs of processing elements may operate in pseudo-lockstep mode while another subset of pairs of processing elements may operate in high-speed mode. The pseudo-lockstep mode or the high speed mode can be part of the configuration of the hardware accelerator device 16 and may be selectable on an algorithm basis.

Additionally or alternatively, in one or more embodiments, a similar safety mechanism may be implemented in the data paths between the processing elements 160 and the configurable coefficient memories 167.

Figure 5:
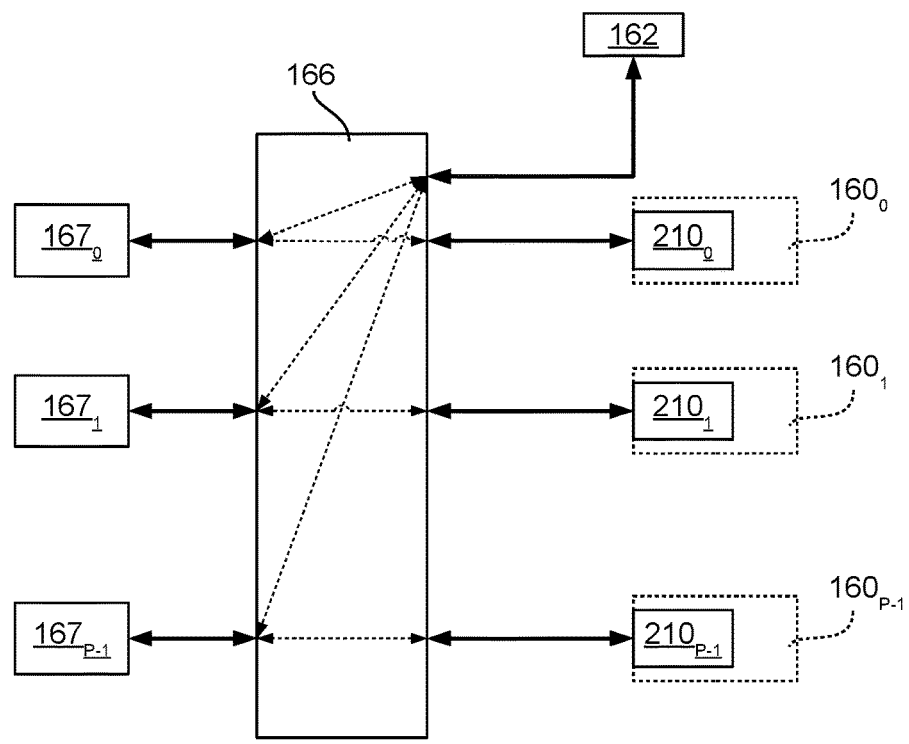
FIG. 5 is a block diagram of an embodiment memory system for use in a hardware accelerator.

For instance, FIG. 5 is a circuit block diagram of an embodiment implementation details of the configurable coefficient memories 167. As exemplified in FIG. 5, each processing element 160 may include a respective memory address generator circuit 210 coupled to the memory controller 166, to which the configurable coefficient memories 167 are coupled. The same read lock-step unit $169_r$ illustrated in FIG. 3 may be coupled to the memory address generator circuit 210 to compare the read requests in the coefficient memories 167 between a functional path and a shadow path. The same start signal $START_o$ used for the DMA controllers 168 may be used for the memory address generator circuit 210.

Additionally or alternatively, in one or more embodiments, a similar safety mechanism may be implemented in the data paths between the processing elements 160 and the read-only memories 165.

For instance, each processing element 160 may include a respective ROM address generator circuit 208 coupled to a ROM controller 164, to which the read-only memories 165 are coupled. The same read lock-step unit $169_r$ illustrated in FIG. 3 may be coupled to the ROM address generator circuit 208 to compare the read requests in the read-only memories 165 between a functional path and a shadow path. The same start signal $START_o$ used for the DMA controllers 168 may be used for the ROM address generator circuit 208.

In one or more embodiments, a hardware accelerator device 16 may comply with the requirements of the ISO 26262 safety standard by protecting (all) the addresses and the stored data (in the RAM memories and/or in the ROM memories) by protection codes such as Double Error Detection (DED), Single Error Correction and Double Error Detection (SECDED), and/or PARITY code.

In one or more embodiments, the control signals of the local interconnect 162 (e.g., a burst length signal, a burst type signal, etc.) may be protected by a DED or PARITY code. Additionally, PARITY bits may be used for protecting local interconnect handshake bits.

In one or more embodiments, the read/write DMA controllers 168, the local data memory controller 163, the configurable memory controller 166 and/or the ROM memory controller 164 may thus implement new functionalities to provide improved functional safety.

In one or more embodiments, the protection scheme may be statically configurable according to the requirements of the processing system 1.

In one or more embodiments, the read DMA controllers 200 may be configured to implement one or more of the following functionalities: generation of DED, SECDED or PARITY code on burst starting address, generation of DED or PARITY code on burst control signals, generation of PARITY bits on output handshake signals, DED, SECDED or PARITY check on incoming read data, and error signaling to a logic fault collection unit (LFCU), and PARITY checks on incoming handshake signals, and error signaling to a logic fault collection unit.

For instance, as exemplified in FIG. 3, a read DMA controller 200 may include: a respective protection code generator circuit 304 configured to generate protection codes of the read requests (address channel, control channel) on the functional read address channel $RA_f$, and a respective protection code checker circuit 306 configured to check the protection codes of the read response (data channel) on the functional read response channel $RR_f$ and duplication of the data channel (with delay) on the shadow read response channel $RR_s$.

In one or more embodiments, the write DMA controllers 204 may be configured to implement one or more of the following functionalities: generation of DED, SECDED or PARITY code on burst starting address, generation of DED or PARITY code on burst control signals, generation of PARITY bits on output handshake signals, generation of DED, SECDED or PARITY code on write data, and PARITY checks on incoming handshake signals, and error signaling to logic fault collection unit.

For instance, as exemplified in FIG. 3, a write DMA controller 204 may include: a respective protection code generator circuit 320 configured to generate protection codes of the write requests (address channel, control channels) on the functional write address channel $WA_f$, and/or to generate protection codes of the write requests (data channel) on the functional write data channel WDf, and a respective protection code checker circuit 324 configured to check the protection codes of the write response on the functional write response channel $WR_f$ and duplication of the response channel (with delay) on the shadow write response channel $WR_s$.

In one or more embodiments, the local data memory controller 163 may be configured to implement one or more of the following functionalities: DED, SECDED, or PARITY check on the incoming burst starting addresses, and error signaling to a logic fault collection unit, propagation of WRITE DATA protection codes to the memory banks M, DED or PARITY checks on incoming control signals, propagation of READ DATA ECC protection codes from the memory banks M to the local interconnect 162, PARITY checks on incoming handshake signals, and error signaling to a logic fault collection unit, and generation of PARITY bits on output handshake signals.

In one or more embodiments, the configurable memory address generator circuit 210 may be configured to implement one or more of the following functionalities: generation of DED, SECDED or PARITY code on address, generation of DED or PARITY code on burst control signals, generation of PARITY bits on output handshake signals, and PARITY checks on incoming handshake signals, and error signaling to a logic fault collection unit.

In one or more embodiments, the configurable memory controller 166 may be configured to implement one or more of the following functionalities: DED, SECDED, or PARITY checks on the incoming burst starting addresses, and error signaling to a logic fault collection unit, DED, SECDED or PARITY checks on read data values, and error signaling to a logic fault collection unit, DED or PARITY checks on incoming local bus control signals, and error signaling to a logic fault collection unit, PARITY checks on incoming handshake signals, and error signaling to a logic fault collection unit, and generation of PARITY bits on output handshake signals.

In one or more embodiments, the ROM address generator 208 may be configured to implement generation of DED, SECDED, or PARITY code on address.

In one or more embodiments, the ROM controller 164 may be configured to implement one or more of the following functionalities: DED, SECDED, or PARITY checks on the incoming addresses, and error signaling to a logic fault collection unit, and DED, SECDED, or PARITY checks on read data value, and error signaling to a logic fault collection unit.

It is noted that the error-correcting code (ECC) protection schemes may provide high coverage on the address and data paths, but they may not be applicable to the control path of the interfaces. Control signals on a target interface (e.g., a memory) may be generated by a logic block (e.g., an FSM, a decoder, etc.) without keeping the source information on the initiator interface (e.g., an internal DMA, an external AXI interface).

Therefore, one or more embodiments may include (even independently from the implementation of a lock-step architecture as previously described) a memory read/write watchdog mechanism to provide an end-to-end (e.g., initiator-memory, such as DMA-memory) safety mechanism on the control path which may facilitate detecting hard and/or soft faults inside the control logic of the memory controllers.

In one or more embodiments, a first type of memory read/write watchdog may be configured to count the number and/or type (read, write, bus width) of memory operations executed during computation of an algorithm (e.g., each algorithm) by a specific initiator (e.g., each initiator).

It is noted that the data flow and the number/type of operations performed in memory by a hardware accelerator device are statically defined depending on the computed algorithm, in contrast to core-implemented solutions where the memory accesses are dependent on the policy, compilation tool chains, etc.

Therefore, one or more embodiments may include for each target interface (e.g., the local or system memory) a read/write watchdog circuit including a set of concurrent read/write counters per initiator device (e.g., a counter for each internal DMA controller, a counter for each external bus interface, etc.). Each read/write watchdog circuit may track all the operations and store the accumulated results in a set of status registers. At the end of the execution of the algorithm, the content of the watchdog status registers may be compared to an expected number of read/write operations, thereby providing a safety mechanism against the possible failure of the control path.

Figure 6A:
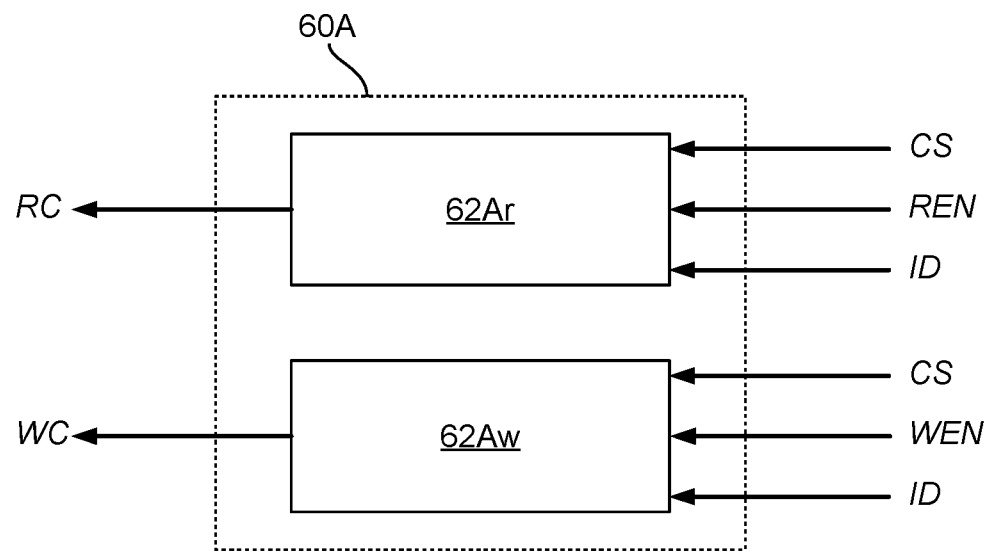
FIG. 6A is a block diagram of an embodiment memory watchdog architecture for use in a hardware accelerator according.

FIG. 6A is a circuit block diagram exemplary of such a first type of memory watchdog for use in one or more embodiments. As exemplified in FIG. 6A, a memory watchdog circuit 60A may include a read counter circuit 62Ar and a write counter circuit 62Aw.

The read counter circuit 62Ar may be configured to receive a respective chip select signal CS, a read enable signal REN, and a respective identification signal ID, which carries information suitable to identify the initiator (e.g., an initiator ID). The read counter circuit 62Ar may be configured to generate an output read count signal RC, e.g., to be propagated to the watchdog status registers in the local control unit 161.

The write counter circuit 62Aw may be configured to receive a respective chip select signal CS, a write enable signal WEN, and a respective identification signal ID which carries information suitable to identify the initiator (e.g., an initiator ID). The write counter circuit 62Aw may be configured to generate an output write count signal WC, e.g., to be propagated to the watchdog status registers in the local control unit 161.

In one or more embodiments, a local memory read/write watchdog circuit 60A may be configured to: trace the number of read accesses (e.g., accumulated) for each initiator (based on the received initiator ID) on algorithm basis, trace the number of write accesses (e.g., accumulated) for each initiator (based on the received initiator ID) on algorithm basis, and optionally, signal faults to a logic fault collection unit in case of failure.

In one or more embodiments, as exemplified in FIG. 6A, the watchdog status may be checked according to different policies. Those policies may be configurable via the control registers of the local control unit. For instance, a watchdog status check policy may include a software check of the watchdog status at the end of the data processing for the configured algorithm. In another example, a watchdog status check policy may include a hardware check (e.g., automatically triggered at the end of the data processing for the configured algorithm) of the expected number of read/write accesses per memory bank and per initiator, optionally with error signaling to a logic fault collection unit in case of failure.

Purely by way of non-limiting example, operation of a memory watchdog mechanism as disclosed with reference to FIG. 6A is exemplified with reference to a matrix multiplication algorithm involving a single processing element 160. A matrix multiplication algorithm may be indicated as $C[n,n]=A[n,n]*B[n,n]$. The input matrices A and B may be pre-loaded in the local memory M by the system DMA controller 14. The output matrix C may be stored in the local memory M by the internal DMA controller 168 of the processing element 160. Therefore, the expected number of write operations executed by the system DMA controller is equal to $2*(n*n)$, the expected number of read operations executed by the internal DMA controller is equal to $2*(n*n*n)$, and the expected number of write operations executed by the internal DMA controller is equal to $n*n$.

Additionally or alternatively, in one or more embodiments, a second type of memory read/write watchdog may be configured to count the number of outstanding memory operations during computation of an algorithm (e.g., each algorithm) by a specific initiator (e.g., each read or write internal DMA), with such a number increasing when a transaction is issued and decreasing when a response is received. Therefore, a memory read/write watchdog of the second type may not count an absolute value of memory accesses, but a relative one (e.g., by a simple up-down counter circuit), which is expected to be equal to zero at the end of the algorithm.

Figure 6B:
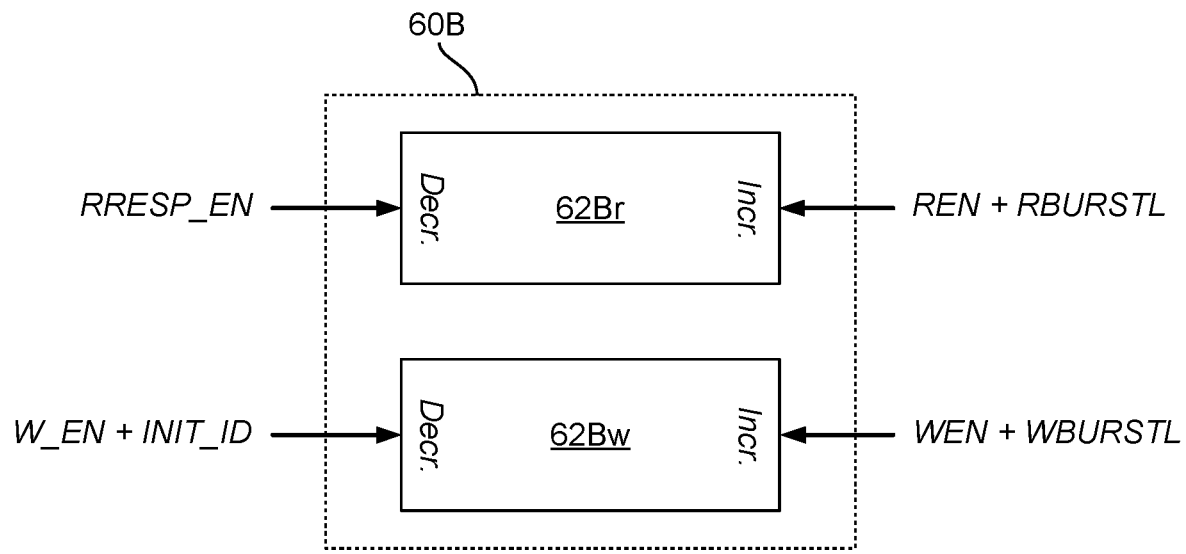
FIG. 6B is a block diagram of another embodiment memory watchdog architecture for use in a hardware accelerator.

FIG. 6B is a circuit block diagram exemplary of such a second type of memory watchdog for use in one or more embodiments. As exemplified in FIG. 6B, a memory watchdog circuit 60B may include a read up-down counter circuit 62Br and/or a write up-down counter circuit 62Bw configured to count a difference between the number of words requested to be read or written by each initiator and the number of words actually read or written.

The read up-down counter circuit 62Br may be configured to receive a respective read enable signal REN and/or a read burst length signal RBURSTL to increase the respective counter value, and receive a respective response enable signal RRESP_EN to decrease the respective counter value. Therefore, in case the initiator interface is a read interface (e.g., the local read DMAs interfaces), the read request and the burst length signals can be used for the increment operation, while the response enable signal (which is used to detect a valid read data) can be used to decrement the up-down counter value. In this exemplary case, all the signals used by the watchdog circuit come from the same initiator interface.

The write up-down counter circuit 62Bw may be configured to receive a respective write enable signal WEN and/or a write burst length signal WBURSTL to increase the respective counter value, and receive a respective write enable signal W_EN and/or and a respective identification signal INIT_ID which carries information suitable to identify the initiator (e.g., an initiator ID) to decrease the respective counter value. Therefore, in case the initiator interface is a write interface (e.g., the local write DMAs interfaces), the write request and burst length signals can be used to increment the number of words requested to be written, while the write enable signals (which are used to detect a valid data) and the initiator IDs at the target interface (e.g., memory controller output) can be used to decrement the number of words.

In one or more embodiments, an initiator interface ID can be propagated from each source to the target (e.g., using the AXI user signals) for protecting the write transactions inside the hardware accelerator device.

At the end of the data processing (e.g., at the end of computation of an algorithm) an external host controller may read the status of the instantiated watchdogs (e.g., one for each initiator) and verify whether the final count values are equal to zero. A mismatch between the number of requests and the number of data actually read/written can be attributed to a fault (e.g., a single point fault, SPF) inside the controllers.

In one or more embodiments, as exemplified in FIG. 6B, the watchdog status may be checked according to different policies. Those policies may be configurable via the control registers of the local control unit. For instance, a watchdog status check policy may include a software check of the watchdog status at the end of the data processing for the configured algorithm (when zero outstanding transactions are expected). In another example, a watchdog status check policy may include a hardware check (e.g., automatically triggered at the end of the data processing for the configured algorithm) of the expected number of outstanding transactions per memory bank and per initiator, optionally with error signaling to a logic fault collection unit in case of failure. In another example, a watchdog status check policy may include a hardware or software run-time monitoring, by an interrupt asserted on a configurable threshold, as a performance metric (latency, peak/average of outstanding transactions).

It is noted that a watchdog mechanism as exemplified in FIG. 6B, which relies on counting the numbers of outstanding transactions in the place of a total number of transactions effected, may provide one or more of the following advantages: easy and immediate watchdog management at the application level (no need to configure the absolute values of transactions for each algorithm), resilience in respect of those algorithms where the number of memory accesses depends on the type/value of the data, and run-time monitoring of the peak/average of the outstanding transactions as additional performance metrics.

In one or more embodiments, providing a memory read/write watchdog circuit as exemplified in FIG. 6A or FIG. 6B may contribute to the overall safety goal (local memory banks M, configuration memory 167, and read-only memory 165) while avoiding the duplication of the internal memory controllers and reaching a satisfactory coverage of single-point faults (SPFs) inside such blocks.

It is noted that, in conventional devices, the safety monitors are usually protected against latent faults by their duplication (e.g., in the case of standard cores) or by application of a Logic Built-In Self Testing (LBIST) procedure applied to the full/partial device.

In order to reduce the area overhead and/or the design complexity due to the duplication of the monitors or the LBIST insertion flow, one or more embodiments may include (even independently from the implementation of a lock-step architecture or a memory watchdog mechanism as previously described) a dedicated hardware Built-In Self Test (BIST) for the safety monitors. In one or more embodiments, such a dedicated hardware BIST may also reduce the unavailability of the device functions, insofar as conventional devices may not be available during execution of LBIST and during a next partial or full reset.

In one or more embodiments, a dedicated hardware BIST may provide one or more of the following features: latent fault (LF) detection for the safety monitors or fault injection to check the monitor to LFCU interface, run-time check (e.g., with a rate time defined at the application level), and fault simulation of the BIST and safety monitors to provide the required stuck-at coverage (e.g., a coverage equal to or higher than 90% for the ASIL-D safety level).

In one or more embodiments, the BIST may be applied to all safety monitors implemented to support the end-to-end protection schemes, the lock-step comparators, the memory watchdog, and others.

Figure 7:
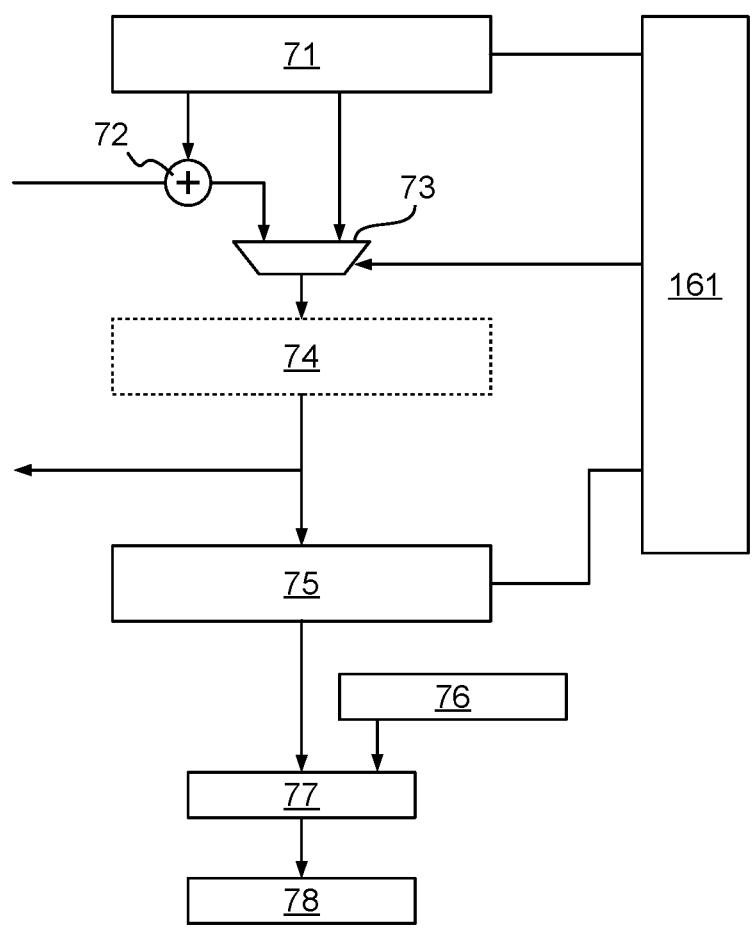
FIG. 7 is a block diagram of an embodiment built-in self-test (BIST) circuitry for use in a hardware accelerator.

FIG. 7 is a circuit block diagram of an embodiment hardware safety monitor BIST according to one or more embodiments. A hardware BIST as exemplified in FIG. 7 may include: the local control unit 161, a pattern generator 71 based on ROM, look-up table or pseudo-random linear feedback shift register (LFSR), or a fault injector 71, an adder node 72 configured to combine data received from the functional path with data produced by the pattern generator/fault injector 71, a selection circuit 73 (e.g., a multiplexer) configured to propagate to the safety monitors 74 either the output data from the adder node 72 or the output data from the pattern generator/fault injector 71, wherein a subset of the safety monitors (e.g., all, single, sequence) can be selected for execution of the BIST procedure, a CRCn (e.g., CRC32, CRC16, etc.) compressor 75 of a subset of safety monitors nodes (measurement points), a comparator circuit block 77 configured to compare the output of the CRCn compressor 75 to a final signature 76 (e.g., a magic value) and/or intermediate values to increase the coverage fault signaling, control and status registers, and an interface 78 to a logic fault collection unit.

In one or more embodiments, the functionality of the hardware accelerator device may be unavailable at run time during the execution of the safety monitors BIST.

In one or more embodiments, a reset of the hardware accelerator device may be required following the execution of the safety monitors BIST.

Since the local control unit 161 may represent a source of failure for the hardware accelerator device 16, one or more embodiments may rely on one or more of the following safety mechanisms: duplication of the FSM and critical parts (status/error registers, interrupts, etc.), and protection codes for the control registers (parity bit or CRC32 checksum).

In one or more embodiments, the interface 78 may include a (simple) two-signal level registered interface. A first signal (e.g., EDPA_cf) may be asserted (e.g., set to logic level 1) if at least one uncorrectable error is detected in the hardware accelerator device. A second signal (e.g., EDPA_ncf) may be asserted (e.g., set to logic level 1) if at least one correctable error is detected inside the hardware accelerator device. Therefore, interface 78 may advantageously signal externally the internally detected errors to let the system 1 (e.g., a System-on-Chip) reach within an acceptable time interval (Fault Tolerant Time Interval) safe states required by the safety goals.

In one or more embodiments, the electronic system 1 may be implemented as an integrated circuit in a single silicon chip or die (e.g., as a system-on-chip). Alternatively, the electronic system 1 may include a distributed system comprising a plurality of integrated circuits interconnected together, e.g., by a printed circuit board (PCB).

Therefore, one or more embodiments as exemplified herein may provide a hardware accelerator device 16 which can be selectively configured (e.g., at run-time) to operate at a certain level of functional safety (e.g., at the ASIL-D level), e.g., when computation of a safety-relevant algorithm is demanded. When computation of a non-safety relevant algorithm is demanded, such computation may be speeded up all the internal computational power is made available.

The functional safety architecture disclosed herein facilitates providing a memory-based hardware accelerator device, and possibly a SoC that integrates the hardware accelerator device, which supports ASIL-D applications with a reduced area overhead.

As exemplified herein, a hardware accelerator device (e.g., 16) may include a set of processing circuits (e.g., 160) arranged in subsets (e.g., in pairs) of processing circuits, a set of data memory banks (e.g., M) coupled to a memory controller (e.g., 163), a control unit (e.g., 161) including configuration registers providing storing space for configuration data of the processing circuits, and an interconnect network (e.g., 162). The processing circuits may be configured as a function of the configuration data stored in the control unit to read (e.g., 200, 202) first input data from the data memory banks via the interconnect network and the memory controller, process (e.g., 20) the first input data to produce output data, and write (e.g., 204, 206) the output data into the data memory banks via the interconnect network and the memory controller. The hardware accelerator device may include a set of configurable lock-step control units (e.g., 169) which interface the processing circuits (for instance, the DMA controllers 168) to the interconnect network, each configurable lock-step control unit (e.g., 169$_o$) in the set of configurable lock-step control units being coupled to a subset of processing circuits (e.g., 160$_o$, 160$_1$) in the set of processing circuits. Each configurable lock-step control unit can be selectively activated (e.g., $LS_{EN}$) to operate in: a first operation mode (e.g., a "lock-step mode" or "pseudo-lockstep mode"), wherein the lock-step control unit (e.g., 169$_{o,r}$, 169$_{o,r}$) is configured to compare data read requests and/or data write requests issued towards the memory controller by a first processing circuit (e.g., 160$_o$) and a second processing circuit (e.g., 160$_1$) in the respective subset of processing circuits to detect a fault, or a second operation mode (e.g., a "high-speed mode" or "performance mode"), wherein the lock-step control unit is configured to propagate towards the memory controller the data read requests and/or data write requests issued by the first processing circuit and by the second processing circuit in the respective subset of processing circuits.

As exemplified herein, the configurable lock-step control units can be selectively activated to operate in the first operation mode or the second operation mode as a function of configuration data stored in the control unit.

As exemplified herein, a hardware accelerator device may include a clock source configured to generate a clock signal. The configurable lock-step control units may be configured to delay (e.g., 400, 402) processing of the first input data by the second processing circuit with respect to the first processing circuit, optionally by a time period of two clock cycles of the clock signal, in response to the configurable lock-step control units operating in the first operation mode.

As exemplified herein, a hardware accelerator device may include at least one read-only memory (e.g., 165) coupled to a ROM controller (e.g., 164). The processing circuits may be configured to read second input data from at least one read-only memory via the ROM controller, and process the second input data to produce the output data. The lock-step control unit may compare data read requests issued towards the ROM controller by the first processing circuit and the second processing circuit in the respective subset of processing circuits to detect a fault in the first operation mode. In the second operation mode, the lock-step control unit may propagate towards the ROM controller the data read requests issued by the first processing circuit and the second processing circuit in the respective subset of processing circuits.

As exemplified herein, a hardware accelerator device may include at least one local configurable memory (e.g., 167) coupled to a configuration memory controller (e.g., 166). The processing circuits may be configured to read third input data from at least one local configurable memory via the configuration memory controller, and process the third input data to produce the output data. In the first operation mode, the lock-step control unit may compare data read requests issued towards the configuration memory controller by the first processing circuit and the second processing circuit in the respective subset of processing circuits to detect a fault. In the second operation mode, the lock-step control unit may propagate towards the configuration memory controller the data read requests issued by the first processing circuit and the second processing circuit in the respective subset of processing circuits.

As exemplified herein, the interconnect network may include at least one control channel configured to exchange control messages. The processing circuits and/or the memory controller may be configured to include a double error detection (DED) code or a parity code in the control messages.

As exemplified herein, the interconnect network may include at least one address channel configured to exchange address messages and at least one data channel configured to exchange data messages. The processing circuits and/or the memory controller may be configured to include a protection code in the address messages and in the data messages. The protection code may include one of a double error detection (DED) code, a parity code or a single error correction double error detection (SECDED) code.

As exemplified herein, the ROM controller may include at least one address channel configured to exchange address messages and at least one data channel configured to exchange data messages. The processing circuits and/or the ROM controller may be configured to include a protection code in the address messages and in the data messages. The protection code may include one of a double error detection (DED) code, a parity code, or a single error correction double error detection (SECDED) code.

As exemplified herein, the configuration memory controller may include at least one address channel configured to exchange address messages and at least one data channel configured to exchange data messages. The processing circuits and/or the configuration memory controller may be configured to include a protection code in the address messages and the data messages. The protection code may include one of a double error detection (DED) code, a parity code, or a single error correction double error detection (SECDED) code.

As exemplified herein, the hardware accelerator device may include an end-to-end mechanism configured to propagate the protection code from the processing circuits to the memory units (e.g., any of the data memory banks M, the read-only memories 165 and/or the local configurable memories 167, depending on the case) and/or from the memory units to the processing circuits via the lock-step control units and the interconnect network as a result of the respective lock-step control unit operating in the first operation mode. Optionally, the end-to-end mechanism may be configured to propagate the protection code between the processing circuits and the memory units as a result of the respective lock-step control unit operating in the second operation mode.

As exemplified herein, a hardware accelerator device may include a first memory watchdog circuit coupled to the data memory banks, wherein the first memory watchdog circuit (e.g., 60A) is configured to count a first number of memory transaction requests received at the data memory banks, and the hardware accelerator device is configured to compare the first counted number of memory transactions to a first expected number of memory transactions to detect a fault. For instance, the first expected number of memory transactions may include a number of memory transactions for execution of a complete algorithm, or a number of memory transactions for execution of a computation cycle of the algorithm. Additionally or alternatively, the first memory watchdog circuit (e.g., 60B) may be configured to count a first number of outstanding memory transaction requests received at the data memory banks, and the hardware accelerator device may be configured to check whether the first counted number of outstanding memory transactions is equal to zero to detect a fault.

Optionally, the first memory watchdog circuit may include a respective counter for each memory transaction initiator. Optionally, the first memory watchdog circuit may be configured to store the first counted number(s) of memory transactions in a status register of the control unit.

As exemplified herein, a hardware accelerator device may include a second memory watchdog circuit coupled to at least one read-only memory, wherein the second memory watchdog circuit is configured to count a second number of memory transaction requests received at at least one read-only memory, and the hardware accelerator device may be configured to compare the second counted number of memory transactions to a second expected number of memory transactions to detect a fault. For instance, the second expected number of memory transactions may include a number of memory transactions for execution of a complete algorithm, or a number of memory transactions for execution of a computation cycle of the algorithm. Additionally or alternatively, the second memory watchdog circuit may be configured to count a second number of outstanding memory transaction requests received at the at least one read-only memory, and the hardware accelerator device may be configured to check whether the second counted number of outstanding memory transactions is equal to zero to detect a fault.

Optionally, the second memory watchdog circuit may include a respective counter for each memory transaction initiator. Optionally, the second memory watchdog circuit may be configured to store the second counted number(s) of memory transactions in a status register of the control unit.

As exemplified herein, a hardware accelerator device may include a third memory watchdog circuit coupled to at least one local configurable memory, wherein the third memory watchdog circuit may be configured to count a third number of memory transaction requests received at at least one local configurable memory, and the hardware accelerator device may be configured to compare the third counted number of memory transactions to a third expected number of memory transactions to detect a fault. For instance, the third expected number of memory transactions may include a number of memory transactions for the execution of a complete algorithm, or a number of memory transactions for the execution of a computation cycle of the algorithm. Additionally or alternatively, the third memory watchdog circuit may be configured to count a third number of outstanding memory transaction requests received at at least one local configurable memory, and the hardware accelerator device may be configured to check whether the third counted number of outstanding memory transactions is equal to zero to detect a fault.

Optionally, the third memory watchdog circuit may include a respective counter for each memory transaction initiator. Optionally, the third memory watchdog circuit may be configured to store the third counted number(s) of memory transactions in a status register of the control unit.

As exemplified herein, a hardware accelerator device may include a built-in self-test pattern generator circuit (e.g., 71) or a fault injector circuit (e.g., 71) configured to inject a test pattern into the lock-step control units to generate respective test output signals and a comparator circuit (e.g., 77) configured to compare the test output signals to an expected test output signal to detect a fault of the lock-step control units.

As exemplified herein, a system (e.g., 1) may include a hardware accelerator device according to one or more embodiments and a fault collection unit, possibly coupled via a system interconnect (e.g., 18). The fault collection unit may be sensitive to the faults detected by the lock-step control units (or by any other safety monitor possibly provided in the hardware accelerator device) and may be configured to set the system into a safe operation mode in response to a fault being detected.

As exemplified herein, a method of operating a hardware accelerator device or a system according to one or more embodiments may include: reading first input data from the data memory banks via the interconnect network and the memory controller, processing, at the processing circuits, the first input data to produce output data, writing the output data into the data memory banks via the interconnect network and the memory controller, and selectively activating the configurable lock-step control units to operate in: a first operation mode, wherein the lock-step control units are configured to compare data read requests and/or data write requests issued towards the memory controller by a first processing circuit and a second processing circuit in the respective subset of processing circuits to detect a fault, or a second operation mode, wherein the lock-step control units are configured to propagate towards the memory controller the data read requests and/or data write requests issued by the first processing circuit and by the second processing circuit in the respective subset of processing circuits.

Without prejudice to the underlying principles, the details and embodiments may vary, even significantly, with respect to what has been described by way of example only, without departing from the extent of protection.

TABLE I

|  | $SP_0$ | $SP_1$ | ... | $SP_{P-1}$ | $SP_P$ | $SP_{P+1}$ |
|---|---|---|---|---|---|---|
| $MP_0$ | X |  |  |  |  |  |
| $MP_1$ |  | X |  |  |  |  |
| ... |  |  | ... |  |  |  |
| $MP_{P-1}$ |  |  |  | X |  |  |
| $MP_P$ |  |  |  |  |  | X |

TABLE II

|            | $SP_0$ | $SP_1$ | ... | $SP_{P-1}$ | $SP_P$ | $SP_{P+1}$ |
|------------|--------|--------|-----|------------|--------|------------|
| $MP_0$     | X      |        |     |            | X      |            |
| $MP_1$     |        | X      |     |            | X      |            |
| ...        |        |        | ... |            | ...    |            |
| $MP_{P-1}$ |        |        |     | X          | X      |            |
| $MP_P$     |        |        |     |            |        | X          |

TABLE III

|            | $SP_0$ | $SP_1$ | ... | $SP_{P-1}$ | $SP_P$ | $SP_{P+1}$ |
|------------|--------|--------|-----|------------|--------|------------|
| $MP_0$     | X      |        |     |            | X      |            |
| $MP_1$     |        | X      |     |            | X      |            |
| ...        |        |        | ... |            | ...    |            |
| $MP_{P-1}$ |        |        |     | X          | X      |            |
| $MP_P$     | X      | (X)    | (X) | (X)        |        | X          |

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A device, comprising:
   a plurality of processors comprising subsets of processors, each processor configurable based on a function of a corresponding configuration data;
   a plurality of data memory banks configured to store input data;
   a memory controller;
   an interconnect network;
   a control unit comprising configuration registers configured to store configuration data for the processors, each processor configured to:
   read a first input data from the data memory banks via the interconnect network and the memory controller,
   generate a first output data based on the first input data, and
   write the first output data into the data memory banks via the interconnect network and the memory controller; and
   a plurality of configurable lock-step control units configured to interface the processors to the interconnect network, each configurable lock-step control unit coupled to a subset of the plurality of processors, each configurable lock-step control unit being selectively activatable to operate in:
   a first operation mode, wherein the respective lock-step control unit is configured to compare data read requests or data write requests issued towards the memory controller by a first processor and a second processor to detect a fault, and
   a second operation mode, wherein the respective lock-step control unit is configured to transmit the data read requests or data write requests issued by the first processor and the second processor towards the memory controller.

2. The device of claim 1, wherein the plurality of configurable lock-step control units are selectively activatable to operate in the first operation mode or the second operation mode based on configuration data of a respective processor.

3. The device of claim 1, further comprising a clock source configured to, in response to the plurality of configurable lock-step control units operating in the first operation mode, generate a clock signal, the plurality of configurable lock-step control units configured to delay processing of the first input data by the second processor with respect to the first processor by a period of two clock cycles.

4. The device of claim 1, further comprising:
   a read-only memory storage coupled to a read-only memory controller,
   wherein each processor is configured to:
   read a second input data from the read-only memory storage via the read-only memory controller, and
   generate a second output data based on the second input data, and
   wherein, in the first operation mode, a respective lock-step control unit is further configured to compare data read requests issued towards the read-only memory controller by the first processor and the second processor to detect a fault, and
   wherein, in the second operation mode, the respective lock-step control unit is further configured to transmit the data read requests issued by the first processor and the second processor towards the read-only memory controller.

5. The device of claim 4, wherein the read-only memory controller comprises an address channel and a data channel, the address channel configured to exchange address messages, the data channel configured to exchange data messages, and wherein one or more of the plurality of processors and the memory controller is configured to include a protection code in the address messages and the data messages, the protection code comprising one of a double-error-detection code, a parity code, or a single-error-correction-double-error-detection code.

6. The device of claim 4, further comprising a first memory watchdog circuit coupled to the plurality of data memory banks, the first memory watchdog circuit configured to:
   count a first number of memory transaction requests received at the plurality of data memory banks, and the device configured to compare the first number of memory transactions to a first expected number of memory transactions to detect a fault; or
   count a first number of outstanding memory transaction requests received at the plurality of data memory banks, and the device configured to check whether the first number of outstanding memory transactions is equal to zero to detect a fault.

7. The device of claim 6, further comprising a second memory watchdog circuit coupled to the read-only memory storage, the second memory watchdog circuit configured to:

count a second number of memory transaction requests received at the read-only memory storage, and the device configured to compare the second number of memory transactions to a second expected number of memory transactions to detect a fault; or count a second number of outstanding memory transaction requests received at the read-only memory storage, and the device configured to check whether the second number of outstanding memory transactions is equal to zero to detect a fault.

8. The device of claim 7, further comprising:
a locally configurable memory storage coupled to a configuration memory controller,
wherein each processor is configured to:
read a third input data from the locally configurable memory storage via the configuration memory controller, and
generate a third output data based on the third input data, and
wherein, in the first operation mode, the respective lock-step control unit is further configured to compare data read requests issued towards the configuration memory controller by the first processor and the second processor to detect a fault, and
wherein, in the second operation mode, the respective lock-step control unit is further configured to transmit the data read requests issued by the first processor and the second processor towards the configuration memory controller.

9. The device of claim 8, wherein the configuration memory controller includes an address channel and a data channel, the address channel configured to exchange address messages, the data channel configured to exchange data messages, and wherein one or more of the plurality of processors and the memory controller is configured to include a protection code in the address messages and in the data messages, the protection code comprising one of a double-error-detection code, a parity code, or a single-error-correction-double-error-detection code.

10. The device of claim 9, further comprising an end-to-end mechanism configured to transmit the protection code from the plurality of processors to one of read-only memory storage or locally configurable memory storage, or from one of read-only memory storage or locally configurable memory storage to the plurality of processors via the respective lock-step control unit and the interconnect network as a result of the respective lock-step control unit operating in the first operation mode.

11. The device of claim 10, further comprising a third memory watchdog circuit coupled to the locally configurable memory storage, the third memory watchdog circuit configured to:
count a third number of memory transaction requests received at the locally configurable memory storage, and the device configured to compare the third number of memory transactions to a third expected number of memory transactions to detect a fault; and
count a third number of outstanding memory transaction requests received at the locally configurable memory storage, and the device configured to check whether the third number of outstanding memory transactions is equal to zero to detect a fault.

12. The device of claim 1, wherein the interconnect network comprises a control channel configured to exchange control messages, and wherein one or more of the plurality of processors and the memory controller is configured to include a double error detection code or a parity code in the control messages.

13. The device of claim 1, wherein the interconnect network comprises an address channel configured to exchange address messages and at least one data channel configured to exchange data messages, and wherein one or more of the plurality of processors and the memory controller is configured to include a protection code in the address messages and in the data messages, the protection code comprising one of a double-error-detection code, a parity code, or a single-error-correction-double-error-detection code.

14. The device of claim 1, further comprising:
a circuit configured to inject a test pattern into the plurality of configurable lock-step control units to generate respective test output signals; and
a comparator circuit configured to compare the respective test output signals to an expected test output signal to detect a fault of the plurality of configurable lock-step control units.

15. A system, comprising:
a device, comprising:
a plurality of processors comprising subsets of processors, each processor configurable based on a function of a corresponding configuration data;
a plurality of data memory banks configured to store input data;
a memory controller;
an interconnect network;
a control unit comprising configuration registers configured to store configuration data for the processors, each processor configured to:
read a first input data from the data memory banks via the interconnect network and the memory controller,
generate a first output data based on the first input data, and
write the first output data into the data memory banks via the interconnect network and the memory controller;
a plurality of configurable lock-step control units configured to interface the processors to the interconnect network, each configurable lock-step control unit coupled to a subset of the plurality of processors, each configurable lock-step control unit being selectively activatable to operate in:
a first operation mode, wherein the respective lock-step control unit is configured to compare data read requests or data write requests issued towards the memory controller by a first processor and a second processor to detect a fault, and
a second operation mode, wherein the respective lock-step control unit is configured to transmit the data read requests or data write requests issued by the first processor and the second processor towards the memory controller; and
a fault collection unit sensitive to faults detected by plurality of configurable lock-step control units, the fault collection unit configured to set the system into a safe operation mode in response to a fault being detected.

16. The system of claim 15, wherein the plurality of configurable lock-step control units are selectively activatable to operate in the first operation mode or the second operation mode based on configuration data of a respective processor.

17. The system of claim 15, wherein the device further comprises a clock source configured to, in response to the plurality of configurable lock-step control units operating in the first operation mode, generate a clock signal, the plurality of configurable lock-step control units configured to delay processing of the first input data by the second processor with respect to the first processor by a period of two clock cycles.

18. A method, comprising:

reading, by one or more processors, first input data from a data memory bank via an interconnect network and a memory controller;

generating, by the one or more processors, a first output data based on the first input data;

writing, by the one or more processors, the first output data into the data memory bank via the interconnect network and the memory controller; and selectively activating one or more configurable lock-step control units to operate in:

comparing, in a first operation mode, data read requests or data write requests issued towards the memory controller by a first processor and a second processor to detect a fault, and transmitting, in a second operation mode, the data read requests or data write requests issued by the first processor and the second processor towards the memory controller.

19. The method of claim 18, wherein selectively activatable comprises operating in one of the first operation mode or the second operation mode based on a configuration data of a respective processor.

20. The method of claim 18, further comprising:

generating, in response to operating in the first operation mode, a clock signal; and delaying, in response to operating in the first operation mode, a processing of the first input data by the second processor with respect to the first processor by a period of two clock cycles.

* * * * *